(12) United States Patent
Steenwyk

(10) Patent No.: US 7,026,861 B2
(45) Date of Patent: Apr. 11, 2006

(54) ELECTRONIC DOOR LATCH SYSTEM WITH WATER REJECTION FILTERING

(75) Inventor: Timothy Edward Steenwyk, Grandville, MI (US)

(73) Assignee: TouchSensor Technologies LLC, Wheaton, IL (US)

( * ) Notice: Subject to any disclaimer, the term of this patent is extended or adjusted under 35 U.S.C. 154(b) by 0 days.

(21) Appl. No.: 10/828,996

(22) Filed: Apr. 20, 2004

(65) Prior Publication Data

US 2005/0068078 A1 Mar. 31, 2005

Related U.S. Application Data

(60) Provisional application No. 60/464,518, filed on Apr. 22, 2003.

(51) Int. Cl.
*H03K 17/945* (2006.01)

(52) U.S. Cl. .................. 327/517; 307/112; 307/116

(58) Field of Classification Search ............... 327/517; 307/112, 116, 125; 200/600; 341/33
See application file for complete search history.

(56) References Cited

U.S. PATENT DOCUMENTS

| | | | | |
|---|---|---|---|---|
| 3,784,848 A | * | 1/1974 | Hamilton, II | 307/116 |
| 3,903,490 A | * | 9/1975 | Sakamoto | 334/15 |
| 4,289,980 A | * | 9/1981 | McLaughlin | 307/116 |
| 5,063,372 A | * | 11/1991 | Gillett | 340/547 |
| 5,153,572 A | * | 10/1992 | Caldwell et al. | 345/174 |
| 5,796,183 A | | 8/1998 | Hourmand | 307/116 |
| 5,856,646 A | | 1/1999 | Simon | 200/600 |
| 6,230,282 B1 | | 5/2001 | Zhang | 714/6 |
| 6,713,897 B1 | | 3/2004 | Caldwell | 307/125 |
| 2003/0122432 A1 | | 7/2003 | Caldwell | 307/125 |
| 2004/0124714 A1 | | 7/2004 | Caldwell | 307/99 |

FOREIGN PATENT DOCUMENTS

| | | |
|---|---|---|
| WO | WO 97/41322 A1 | 11/1997 |
| WO | WO 01/40606 A1 | 6/2001 |
| WO | WO 02/21455 A1 | 3/2002 |
| WO | WO 02/33203 A1 | 4/2002 |
| WO | WO 02/45030 A1 | 6/2002 |

* cited by examiner

*Primary Examiner*—Tuan T. Lam
(74) *Attorney, Agent, or Firm*—Jenner & Block LLP

(57) ABSTRACT

A control circuit receives inputs from first and second field effect sensors. The control circuit produces a control output only if the second field effect sensor senses proximity or touch more than a predetermined time after the first field effect sensor senses proximity or touch.

13 Claims, 4 Drawing Sheets

US 7,026,861 B2

ELECTRONIC DOOR LATCH SYSTEM WITH WATER REJECTION FILTERING

CROSS REFERENCE TO RELATED APPLICATIONS

This application claims priority from U.S. Provisional Patent Application Ser. No. 60/464,518, entitled "Electronic Door Latch System with Water Rejection Filtering" and filed on Apr. 22, 2003, the disclosure of which is incorporated herein by reference.

BACKGROUND OF THE INVENTION

1. The Technical Field

The present invention is directed to an electronic control system for a door latch release mechanism, including means for rejecting false actuation signals caused by environmental effects or otherwise.

2. The Related Art

Common automobile door latches are purely mechanical devices having a mechanical latch and a mechanical release mechanism operated by a mechanical pushbutton, pull handle, or the like. In recent years, some automobile manufacturers have offered electrically-operated door latch mechanisms. These mechanisms typically use a conventional mechanical latch with an electrically-operated release mechanism controlled by a conventional membrane switch. Membrane switches typically are sealed to environment, and, therefore, they are a logical design choice for use on an automobile's exterior. However, under its protective cover, a membrane switch is basically a mechanical push button switch whose movable contact is moved by flexing the protective cover. As such, the protective cover can deteriorate and crack, allowing moisture and contaminants to enter the internals of the switch, ultimately leading to failure of the switch. Further, ice buildup, as is common in northern climates in the winter months, can render a membrane switch inoperable.

Field effect sensors which respond to proximity or touch of a stimulus, for example, touch of human finger, are superior to membrane switches in that they are solid state devices having no moving parts to wear out. However, conventional field effect sensors are not ideally suited for harsh environments, such as the outside of an automobile, because they also can be unintentionally actuated by other stimuli, such as pooled or flowing water or other contaminants. As such, an electrically operated automobile door latch controlled by a conventional field effect sensor could release spuriously and unintentionally when the automobile is parked in the rain or run through a carwash.

SUMMARY OF THE INVENTION

The present invention uses one or field effect sensors and a control circuit incorporating a time delay to distinguish between intentional and spurious stimuli affecting the field effect sensors. In a preferred embodiment, the present invention also takes advantage of geometric considerations in filtering out unintended actuations.

DETAILED DESCRIPTION OF THE ILLUSTRATED EMBODIMENT

Figure 1A:
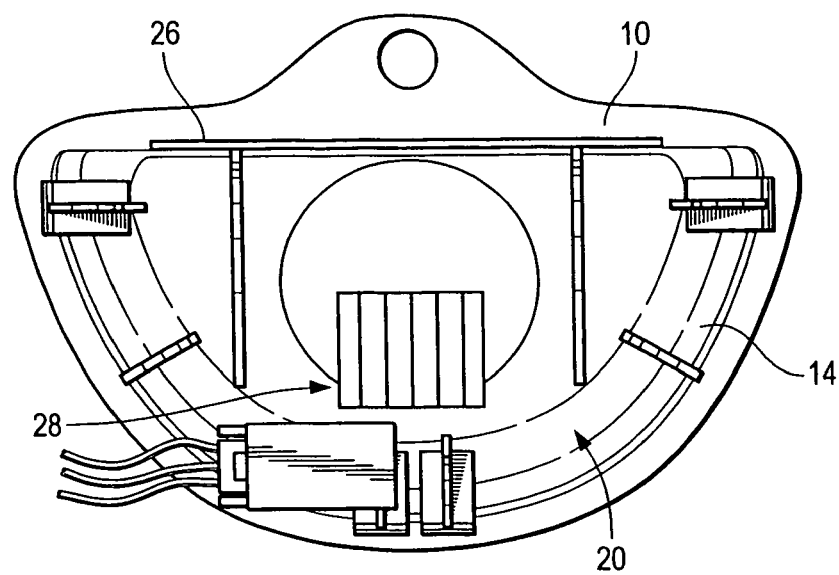
FIG. 1A is a front elevation view of an automobile lift gate or door handle according to the present invention.
Figure 1B:
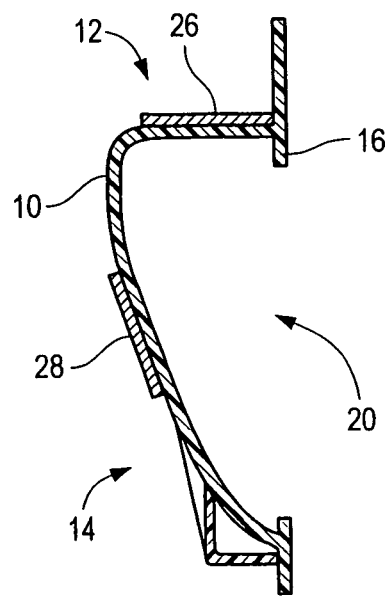
FIG. 1B is a side elevation view of an automobile lift gate handle according to the present invention.

FIGS. 1A and 1B illustrate a handle shell 10 as be would installed in a lift-gate or door of an automobile. Shell 10 includes a substantially flat portion 12, a substantially curved portion 14 and a lip 16, wherein flat portion 12 defines an upper surface 18 and a lower surface 20, curved portion 14 defines a concavity 20 having an outer surface 20 and an inner surface 22, and lip 16 defines a rear surface 24. Shell 10 typically would be installed with flat portion 12 oriented toward the top of the lift gate or door and curved portion 14 oriented toward the bottom of the lift gate or door. Shell 10 typically would be configured to receive a person's hand, with palm facing away from shell 10, such that the person's fingertips would extend to lower surface 20 of flat portion 12 and rear surface 24 of lip 16.

Figure 2:
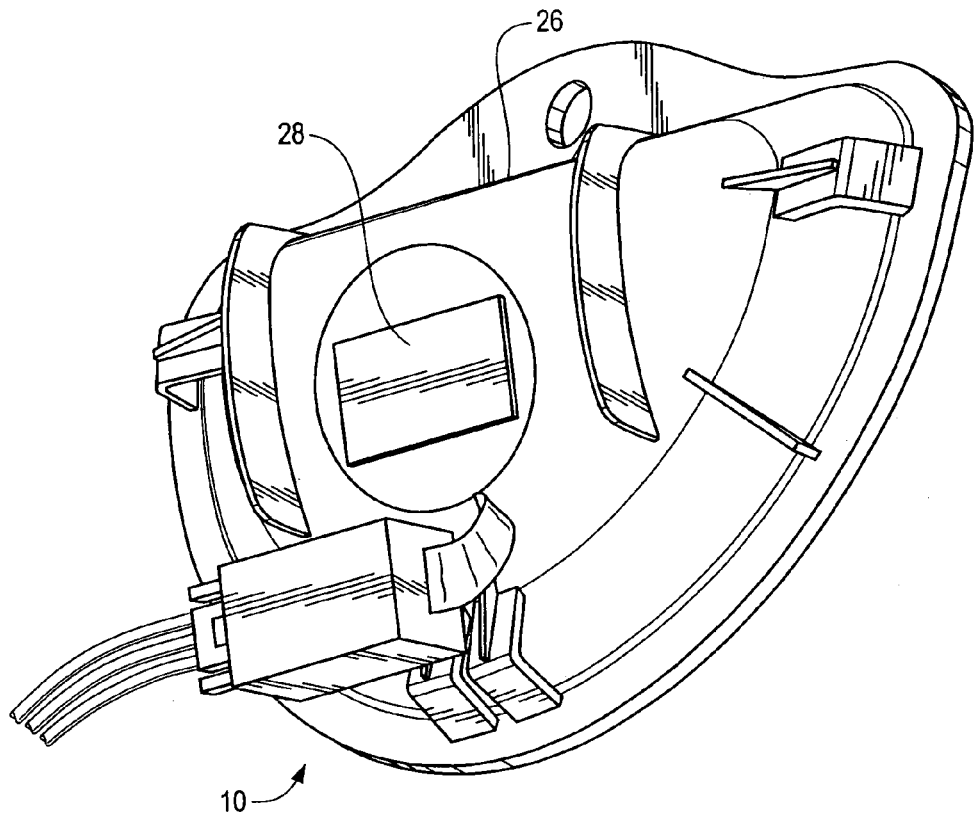
FIG. 2 is a rear perspective view of an automobile lift gate or door handle according to the present invention.

Referring to FIG. 2, a first field effect sensor, or touch sensor, 26 is positioned on upper surface 18 of flat portion 12. As discussed below and illustrated in FIGS. 3, 4A and 4B, a preferred touch sensor 26 includes first and second electrodes 26A,26B and a control circuit 26C. Electrodes 26A,26B preferably cover most or substantially all of flat portion 12. In alternate embodiments, touch sensor 26 could have more or fewer electrodes, and it could be positioned on lower surface 20 of flat portion 12 or embedded within flat section 12. Alternatively, touch sensor 26 could be located within or on a rear surface of lip 16.

A second field effect sensor, or water sensor, 28 is positioned generally at the center of inner surface 22 of curved portion 14. Similar to the preferred touch sensor 26, a preferred water sensor 28 includes first and second electrodes 28A,28B and a control circuit 28C. Preferably, electrodes 28A,28B cover a substantial portion of the center of inner surface 22 of curved portion 14. In other embodiments, water sensor 28 could be positioned on outer surface 24 of curved portion 14, or water sensor 28 could be embedded within curved portion 14.

Figure 3:
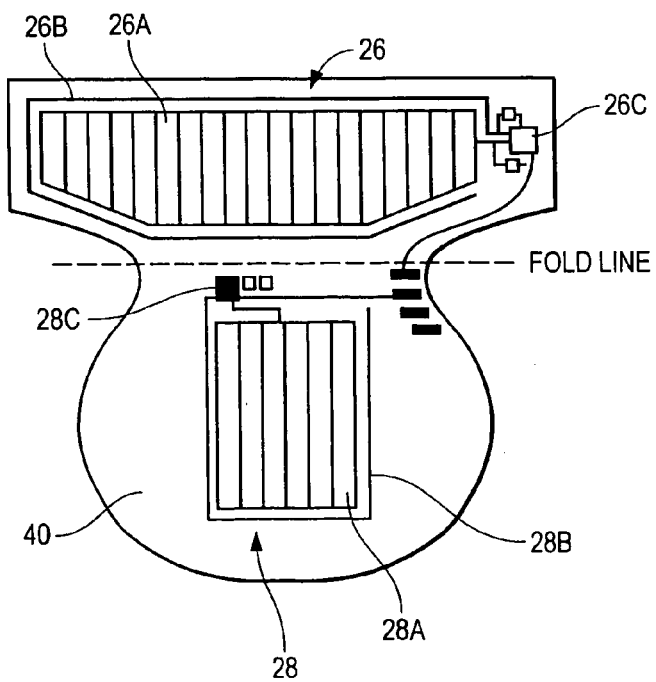
FIG. 3 is a plan view of a flexible substrate including a plurality of sensors according to the present invention.

Referring to FIG. 3, touch sensor 26 (including first and second electrodes 26A,26B and control circuit 26C) and water sensor 28 (including first and second electrodes 28A, 28B and control circuit 28C) preferably are borne on a flexible substrate 40. Flexible substrate 40 can be bonded or otherwise adhered to the rear side of shell 10 so that touch sensor 26 and water sensor are located on flat portion 12 and curved portion 14, respectively, or as otherwise desired. In embodiments where shell 10 is formed by molding, flexible substrate 40 can be embedded within shell 10 during the molding process. Alternatively, touch sensor 26 and water sensor 28 can be borne on individual substrates, each of which can be separately applied to or embedded within shell 10. In other embodiments, touch sensor 26 and water sensor 28 can be applied directly to shell 10.

Preferably, touch sensor 26 and water sensor 28 are embodied as field effect sensors using the TS100 integrated control circuit available from TouchSensor Technologies, LLC of Wheaton, Ill. Many of the design and operating principles of the TS100 sensor are described in U.S. Pat.

Nos. 6,230,282 and 6,713,897 and related U.S. patent application Ser. Nos. 10/272,377 10/725,908, the disclosures of which are incorporated herein by reference. The TS100 sensor is designed to offer substantial resistance to spurious actuation, for example, due to water coming in contact with or proximity to the sensor. The principles of the present invention offer further resistance to spurious actuation.

FIG. 4 illustrates an embodiment of a control circuit 50 according to the present invention. Output 27 of touch sensor 26 is coupled to input 54A of AND gate 54 and to rising edge sensitive input A of touch sensor timer 52. Complementary pulse output $\overline{Q}$ of touch sensor timer 52 is coupled to input 54B of AND gate 54. Output 54C of AND gate 54 is coupled to input 56A of AND gate 56.

Output 29 of water sensor 28 is coupled to input 58A of OR gate 58 and to falling edge sensitive input B of water sensor timer 60. Pulse output Q of water sensor timer 60 is coupled to input 58B of OR gate 58. Output 58C of OR gate 58 is coupled to the input of inverter 62, the output of which is coupled to input 56B of AND gate 56. The output of AND gate 56 is coupled to the gate of FET 64, the output of which is coupled to and controls the door latch (not shown).

Touch sensor 26 responds to stimuli, for example, a finger or water, proximate touch sensor 26. In the absence of a stimulus, output 27 of touch sensor 26 is low. With a stimulus present proximate touch sensor 26, output 27 of touch sensor 26 goes high and remains high until the stimulus is removed. Water sensor 28 operates in the same way.

Touch sensor timer 52 responds to input received from output 27 of touch sensor 26 as follows. In the steady state, complementary pulse output $\overline{Q}$ of touch sensor timer 52 is high. When input A of touch sensor timer 52 senses a low-to-high transition, as it would when touch sensor 26 goes from the unstimulated condition to the stimulated condition and output 27 of touch sensor 26 goes from low to high, touch sensor timer 52 is triggered, and complementary pulse output $\overline{Q}$ goes low and remains low until touch sensor timer 52 times out. Complementary pulse output $\overline{Q}$ then returns to the high (steady) state. Touch sensor timer 52 is retriggered each time input A senses a low-to-high transition, regardless of the state of touch sensor timer 52 when input A senses such a low to high transition. In the preferred embodiment, touch sensor timer 52 times out about 300 msec after sensing the most recent low-to-high transition at input A.

Water sensor timer 60 responds to input received from output 29 of water sensor 28 as follows. In the steady state, pulse output Q of water sensor timer 60 is low. When input B of water sensor timer 60 senses a high-to-low transition, as it would when water sensor 28 goes from the stimulated condition to the unstimulated condition and output 29 of water sensor 28 goes from high to low, water sensor timer 60 is triggered and pulse output Q goes high and remains high until water sensor timer 60 times out. Pulse output Q then returns to the low (steady) state. Water sensor timer 60 is retriggered each time input B senses a high-to-low transition, regardless of the state of water sensor timer 60 when input B senses such a high-to-low transition. In the preferred embodiment, water sensor timer 60 times out about 5 sec after sensing the most recent high-to-low transition at input B.

In the normal state, neither touch sensor 26 nor water sensor 28 is stimulated. In this state, output 27 of touch sensor 26 is low and complementary pulse output $\overline{Q}$ of touch sensor timer 52 is high. Thus, input 54A to AND gate 54 is low, input 54B to AND gate 54 is high, and output 54C of AND gate is low. Also, both output 29 of water sensor 28 and pulse output Q of water sensor timer 60 are low. Thus, both inputs 58A,58B to OR gate 58 are low and output 58C of OR gate is low. It follows that input 56A to AND gate 56 is low, input 56B to AND gate 56 is high, and output 56C of AND gate is low. Thus, FET 64 is in the "off" state and does not provide a release signal to the door latch.

When a stimulus is provided to touch sensor 26, output 27 of touch sensor 26 goes high and remains high until the stimulus is removed. As discussed above, this low-to-high transition triggers touch sensor timer 52 and causes complementary pulse output $\overline{Q}$ to go low until touch sensor timer 52 times out. Thus, immediately after touch sensor 26 receives a stimulus, input 54A of AND gate 54 goes high and input 54B of AND gate goes low. Consequently, output 54C of AND gate 54 remains low. It follows that input 56A and output 56C of AND gate 56 also remain low and that FET 64 remains in the "off" state and does not provide a release signal to the door latch.

Once touch sensor timer 52 times out and returns to the steady state condition (about 300 msec in the preferred embodiment), complementary pulse output $\overline{Q}$ returns to the high state. If the stimulus is still present at touch sensor 26, as would be the case if a person intended to release the door latch, both inputs 54A,54B to AND gate 54 will be high. Consequently, output 54C of AND gate 54 and input 56A of AND gate 56 will be high. With input 56B of AND gate 56 also high, output 56C of AND gate 56 is high, biasing FET 64 to the "on" state, whereby FET 64 provides a release signal to the door latch.

However, if the stimulus is no longer present at touch sensor 26 when the timer times out, as might be the case if a person spuriously brushed against touch sensor 26 or water contacted touch sensor 26 and then dropped away from touch sensor 26, input 54A returns to the normal low state prior to input 54B returning to the high (steady) state. Therefore, output 54C of AND gate is low, input 56A of AND gate 56 is low, output 56V of AND gate 56 is low, FET 64 is "off" and no release signal is provided to the door latch.

It is apparent from the foregoing discussion that touch sensor timer 52 and the logic associated with it reduce the likelihood of an unintended release of the door latch. Water sensor 28, water sensor timer 60, and the logic associated with these components further reduce the likelihood of such an unintended release.

When a stimulus, for example, water from a rain shower or car wash, is applied to water sensor 28, output 29 of water sensor 28 goes high. Consequently, input 58A to OR gate 58 goes high, output 58C of OR gate 58 goes high, the output of inverter 62 goes low and input 56B of AND gate 56 goes low, thus disabling the door latch release. Also, pulse output Q of water sensor timer 60 (and, therefore, input 58B to OR gate 58) goes high and remains high until water sensor timer 60 times out and returns to the steady state (about 5 sec in the preferred embodiment). As such, the door latch cannot be released while any stimulus is applied to water sensor 28 or for 5 seconds after any stimulus is removed from water sensor 28, regardless of the state of touch sensor 26 and its associated logic.

Figure 4A:
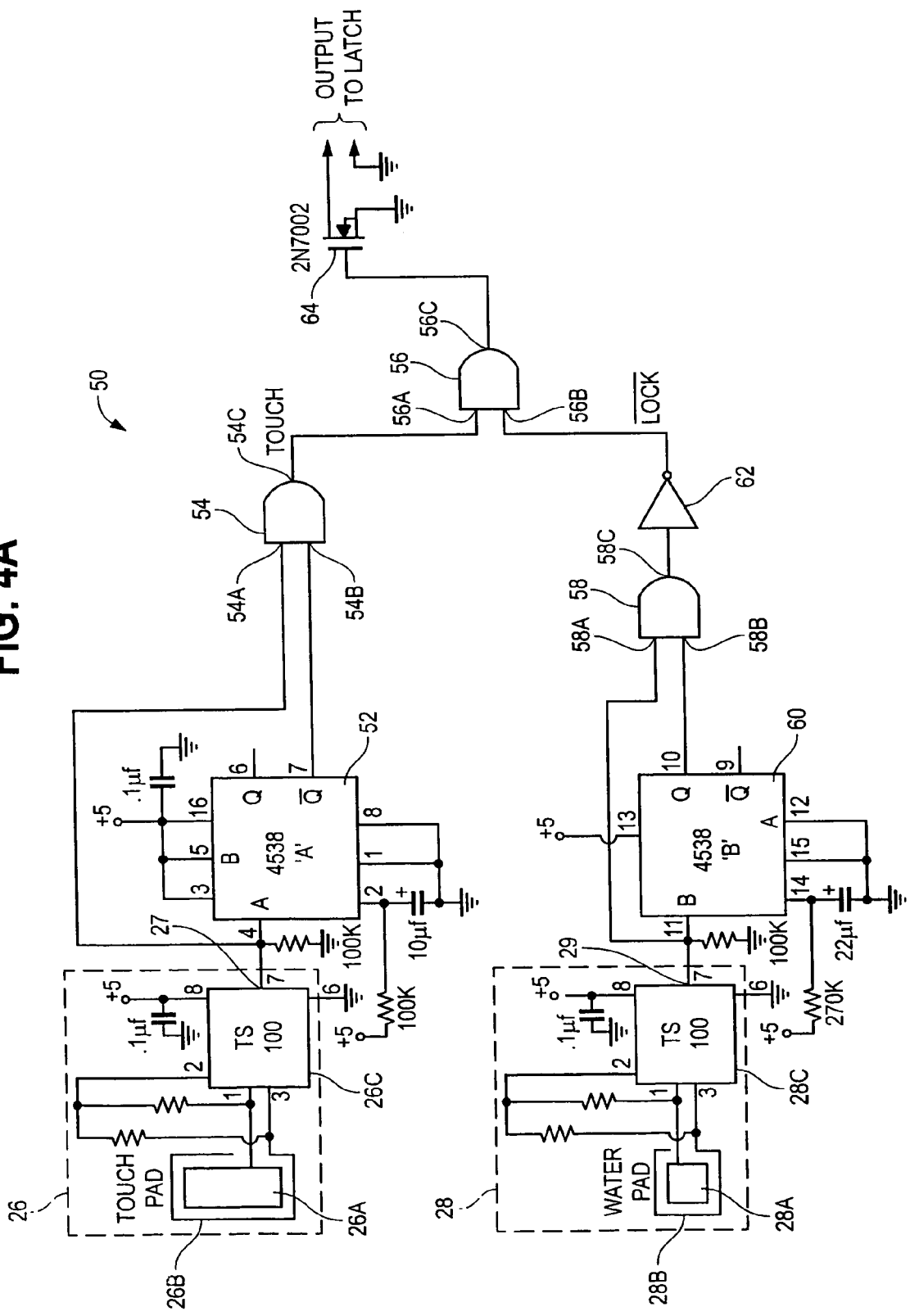
FIG. 4A is a schematic representation of a control circuit according to the present invention.
Figure 4B:
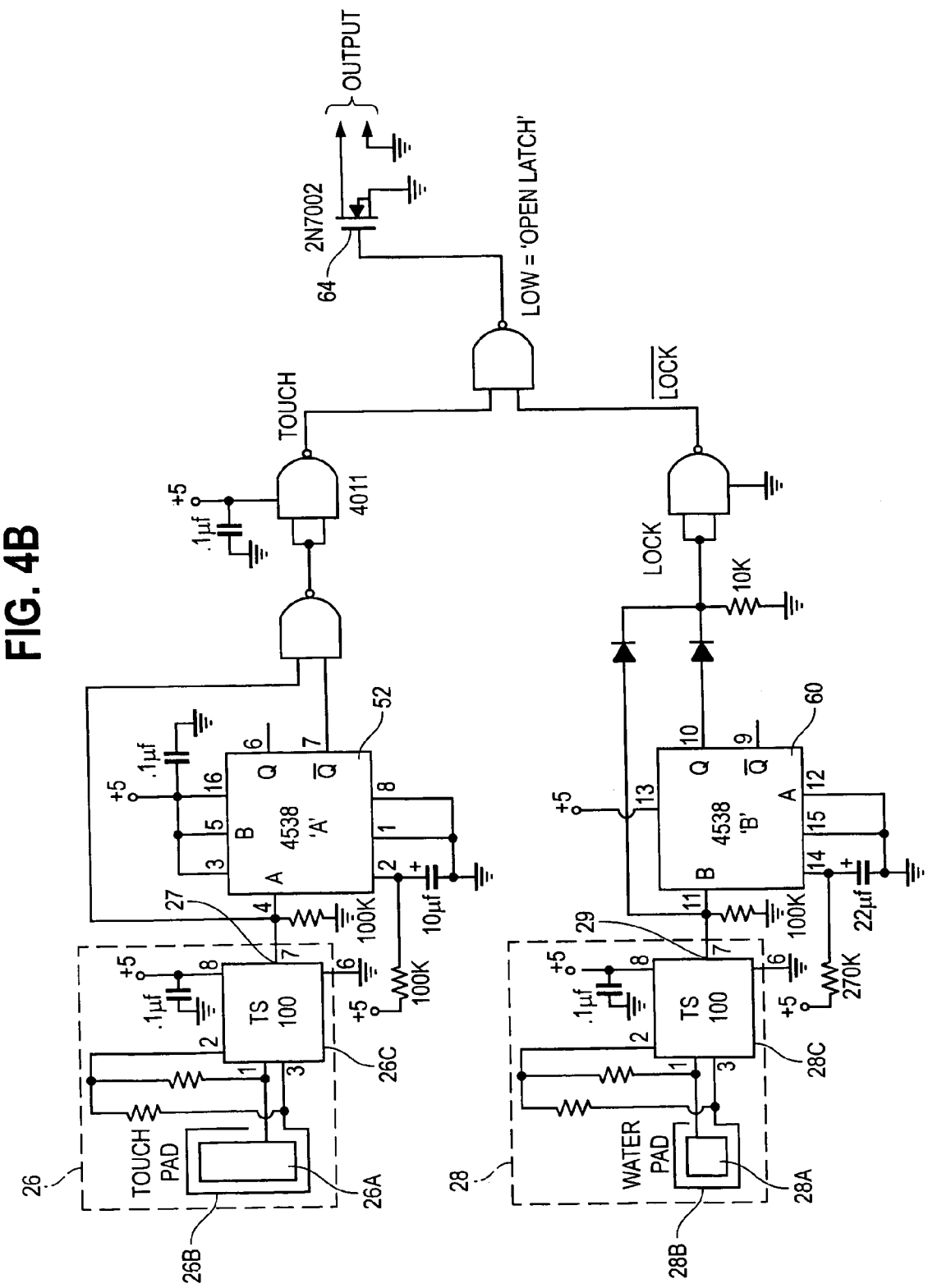
FIG. 4B is a schematic representation of an alternate control circuit according to the present invention

The logic circuit illustrated in FIG. 4B is functionally identical to the one illustrated in FIG. 4A, as would be apparent to one skilled in the art. However, the logic is effected using only NAND gates instead of AND and OR gates and an inverter. The FIG. 4B embodiment is preferable in practice because it uses fewer different parts and therefore is likely to be less expensive to manufacture.

Additional filtering against unintended actuation of the door latch is provided by the geometry of shell 10, the placement of touch sensor 26 and water sensor 28 on shell 10, and other geometric considerations. For example, any water coming into contact or proximity with shell 10 is likely to come into contact or proximity with water sensor 28 before touch sensor 26, thus disabling the door latch release before water has an opportunity to come into contact or proximity with touch sensor 26. Even if water were to come into contact or proximity with touch sensor 26 before water sensor 28, gravity likely would cause the water to drip off of touch sensor 26 or the corresponding portion of shell 10 and onto water sensor 28 in less than 300 msec. As discussed above, touch sensor 26 must be stimulated continuously for at least 300 msec in order for a door latch release signal to be generated (and the door latch release signal must not be disabled by present stimulation of water sensor 28 or destimualtion of water sensor 28 at any time in the prior 5 second period). Also, the convex curvature of shell 10 makes it unlikely that the back of a human hand would lie in contact with outer surface 24 of curved portion 14 at more than a few discrete points. Thus, it is unlikely that proximity of a human hand would actuate water sensor 28.

Although the present invention has been described in terms of an electronic door latch control system for an automobile, it could be used in connection with other latch mechanisms, as well. Also, the invention could be practiced using other sensor types and circuit logic. One skilled in the art would know how to modify the teachings of this disclosure without departing from the scope of the claims which define the invention.

I claim:

1. An electronic control circuit, comprising:
   a first field effect sensor;
   a second field effect sensor;
   a time delay circuit;
   wherein said control circuit produces a control output only when said second field effect sensor senses proximity or touch at least a predetermined time after said first field effect sensor senses touch or proximity.

2. A method for controlling an electric release mechanism, comprising the steps of:
   processing an input from a first field effect sensor;
   processing an input from a second field effect sensor;
   producing a control output only if said input from said second field effect sensor is received more than a predetermined time after said input from said first field effect sensor.

3. The control circuit of claim 1 further comprising:
   a handle shell, said first field effect sensor and said second field effect sensor operably associated with said handle shell.

4. The control circuit of claim 3 wherein said handle shell comprises a first surface and a second surface, said first field effect sensor operably associated with said first surface and said second field effect sensor operably associated with said second surface.

5. The control circuit of claim 4 wherein a portion of said handle shell is configured to receive a hand such that a first portion of said hand is proximate said first surface and a second portion of said hand is proximate said second surface.

6. The control circuit of claim 5 wherein said handle shell is installed in a panel.

7. The control circuit of claim 6 wherein said panel comprises a door.

8. The control circuit of claim 3 wherein at least one of said first field effect sensor and said second field effect sensor is disposed on said handle shell.

9. The control circuit of claim 3 wherein at least one of said first field effect sensor and said second field effect sensor is embedded within the material comprising said handle shell.

10. The control circuit of claim 1 further comprising a dielectric substrate, said first field effect sensor and said second field effect sensor disposed on said dielectric substrate.

11. The control circuit of claim 10 further comprising a handle shell having a first surface and a second surface, said handle shell configured to receive a hand such that a first portion of said hand is proximate said first surface and a second portion of said hand is proximate said second surface, said dielectric substrate disposed on said handle shell such that said first field effect sensor is operably associated with said first surface and said second field effect sensor is operably associated with said second surface.

12. The control circuit of claim 11 wherein said handle shell is installed in a panel.

13. The control circuit of claim 12 wherein said panel comprises a door.

* * * * *

UNITED STATES PATENT AND TRADEMARK OFFICE
CERTIFICATE OF CORRECTION

PATENT NO. : 7,026,861 B2  Page 1 of 1
APPLICATION NO. : 10/828996
DATED : April 11, 2006
INVENTOR(S) : Timothy Edward Steenwyk It is certified that error appears in the above-identified patent and that said Letters Patent is hereby corrected as shown below:

Column 3, Line 12:

Delete "Q" and insert -- $\overline{Q}$ --.

Signed and Sealed this

Eighteenth Day of July, 2006

JON W. DUDAS
*Director of the United States Patent and Trademark Office*